US011936357B2

(12) United States Patent
Din

(10) Patent No.: US 11,936,357 B2
(45) Date of Patent: Mar. 19, 2024

(54) INTEGRATED ISOLATOR CIRCUIT IN A TIME DIVISION DUPLEX TRANSCEIVER

(71) Applicant: Telefonaktiebolaget LM Ericsson (publ), Stockholm (SE)

(72) Inventor: Imad ud Din, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 332 days.

(21) Appl. No.: 17/346,570

(22) Filed: Jun. 14, 2021

(65) Prior Publication Data

US 2021/0305963 A1 Sep. 30, 2021

Related U.S. Application Data

(63) Continuation of application No. 16/483,600, filed as application No. PCT/EP2017/052978 on Feb. 10, 2017, now Pat. No. 11,063,570.

(51) Int. Cl.
| | |
|---|---|
| *H03H 7/00* | (2006.01) |
| *H03H 7/09* | (2006.01) |
| *H03H 7/38* | (2006.01) |
| *H03H 7/46* | (2006.01) |

(52) U.S. Cl.
CPC .......... *H03H 7/465* (2013.01); *H03H 7/004* (2013.01); *H03H 7/09* (2013.01); *H03H 7/38* (2013.01); *H03H 7/461* (2013.01); *H03H 2007/386* (2013.01)

(58) Field of Classification Search
None
See application file for complete search history.

(56) References Cited

U.S. PATENT DOCUMENTS

| | | | |
|---|---|---|---|
| 2,561,087 A | 7/1951 | Anderson | |
| 5,670,881 A | 9/1997 | Arakawa et al. | |
| 6,169,912 B1 * | 1/2001 | Zuckerman | H04B 1/525 455/63.1 |
| 6,847,829 B2 | 1/2005 | Tanaka et al. | |
| 7,010,279 B2 * | 3/2006 | Rofougaran | H03F 1/52 455/292 |
| 7,369,096 B2 * | 5/2008 | Castaneda | H04B 1/38 455/333 |
| 7,801,493 B2 * | 9/2010 | Do | H04B 1/44 455/248.1 |

(Continued)

FOREIGN PATENT DOCUMENTS

EP 1083672 A1 3/2001

*Primary Examiner* — Kenneth B Wells
(74) *Attorney, Agent, or Firm* — Murphy, Bilak & Homiller, PLLC

(57) ABSTRACT

An integrated isolator circuit for isolating receiver and transmitter in a Time-Division Duplex transceiver is disclosed. The integrated isolator circuit comprises a first node, a second node and a third node. The integrated isolator circuit further comprises a fist capacitor connected in series with a first switch and connected between the first and second nodes. The integrated isolator circuit further comprises a first inductor connected between the first and second nodes and a second capacitor connected between the second node and the third node. The first switch has an on state and an off state, and the integrated isolator circuit is configured to have a different impedance at a certain operating frequency by controlling the state of the first switch.

20 Claims, 11 Drawing Sheets

(56) References Cited

U.S. PATENT DOCUMENTS

| | | | |
|---|---|---|---|
| 7,890,066 B2 * | 2/2011 | Rofougaran | H01Q 1/002 455/283 |
| 8,044,540 B2 * | 10/2011 | Lee | H03K 17/693 307/115 |
| 8,063,718 B2 * | 11/2011 | Ueda | H04B 1/18 333/133 |
| 8,208,865 B2 * | 6/2012 | Mikhemar | H04B 1/525 343/702 |
| 8,208,866 B2 * | 6/2012 | Mikhemar | H04B 1/40 455/550.1 |
| 8,279,018 B1 * | 10/2012 | Song | H04B 1/581 333/132 |
| 8,442,453 B2 * | 5/2013 | Chiang | H04B 1/18 455/78 |
| 8,483,627 B2 * | 7/2013 | Rajendran | H03F 3/195 327/530 |
| 8,514,035 B2 * | 8/2013 | Mikhemar | H04B 5/0093 455/73 |
| 8,792,836 B2 * | 7/2014 | Mikhemar | H04B 1/582 455/78 |
| 8,854,155 B2 * | 10/2014 | Mikhemar | H04B 1/52 333/132 |
| 8,909,161 B2 * | 12/2014 | Din | H04B 1/525 455/73 |
| 8,933,858 B2 * | 1/2015 | Sabouri | H04B 1/0458 343/860 |
| 8,948,709 B2 * | 2/2015 | Kwok | H04B 1/48 455/73 |
| 8,971,219 B2 * | 3/2015 | Choksi | H03H 7/09 370/282 |
| 9,000,860 B2 * | 4/2015 | Mikhemar | H04B 15/00 455/78 |
| 9,031,517 B2 * | 5/2015 | Jerng | H04B 1/44 330/252 |
| 9,042,844 B2 * | 5/2015 | Yu | H04B 1/44 330/276 |
| 9,094,104 B2 * | 7/2015 | Din | H04B 1/525 |
| 9,143,186 B2 * | 9/2015 | Andersson | H04B 1/525 |
| 9,154,289 B2 * | 10/2015 | Mikhemar | H04B 1/52 |
| 9,214,918 B2 * | 12/2015 | Mikhemar | H03H 7/09 |
| 9,318,801 B2 * | 4/2016 | Judson | H04B 1/581 |
| 9,356,643 B2 * | 5/2016 | Khlat | H04B 1/525 |
| 9,374,127 B2 * | 6/2016 | Lehtinen | H04B 1/525 |
| 9,548,715 B2 * | 1/2017 | Van Liempd | H03H 7/40 |
| 9,667,404 B2 * | 5/2017 | Sjöland | H04B 1/109 |
| 9,680,441 B2 | 6/2017 | Iizuka et al. | |
| 9,680,521 B2 * | 6/2017 | Andersson | H04L 5/14 |
| 9,774,365 B2 * | 9/2017 | Bryant | H04L 5/14 |
| 9,853,623 B2 * | 12/2017 | Larson | H03H 7/463 |
| 9,871,552 B2 * | 1/2018 | Din | H04B 1/40 |
| 9,900,044 B2 * | 2/2018 | Sjoland | H04L 43/028 |
| 9,923,593 B2 * | 3/2018 | Andersson | H04B 1/123 |
| 10,027,465 B2 * | 7/2018 | Sjöland | H04L 5/14 |
| 10,079,671 B2 * | 9/2018 | Sjöland | H04L 5/1461 |
| 10,200,079 B2 * | 2/2019 | Din | H04B 1/109 |
| 10,348,356 B2 * | 7/2019 | Andersson | H04B 1/44 |
| 10,355,741 B2 * | 7/2019 | Khatib | H04B 5/0075 |
| 10,530,615 B1 * | 1/2020 | Hur | H04B 1/0475 |
| 10,637,528 B2 * | 4/2020 | Liu | H01F 21/00 |
| 10,673,395 B2 | 6/2020 | Watanabe et al. | |
| 10,715,204 B2 * | 7/2020 | Hur | H04B 1/0458 |
| 10,911,091 B2 * | 2/2021 | Emira | H04B 1/44 |
| 10,938,542 B1 * | 3/2021 | Muharemovic | H04B 1/16 |
| 11,171,683 B2 * | 11/2021 | Elsayed | H03K 17/081 |
| 11,265,038 B1 * | 3/2022 | Muharemovic | H03F 3/245 |
| 11,368,342 B2 * | 6/2022 | Dorn | H04L 27/2601 |
| 11,476,814 B2 * | 10/2022 | Varonen | H03F 3/45475 |
| 11,705,935 B2 * | 7/2023 | Mesquita | H04B 1/525 455/552.1 |
| 2006/0030277 A1 | 2/2006 | Cyr et al. | |
| 2007/0232241 A1 | 10/2007 | Carley et al. | |
| 2010/0259319 A1 | 10/2010 | Chan et al. | |
| 2013/0241666 A1 | 9/2013 | Khlat et al. | |
| 2014/0313947 A1 | 10/2014 | Ali-Ahmad | |
| 2015/0303976 A1 | 10/2015 | Khlat et al. | |
| 2016/0294436 A1 | 10/2016 | Din et al. | |

\* cited by examiner

INTEGRATED ISOLATOR CIRCUIT IN A TIME DIVISION DUPLEX TRANSCEIVER

RELATED APPLICATIONS

This application is a continuation of U.S. application Ser. No. 16/483,600 filed 5 Aug. 2019 now issued as U.S. Pat. No. 11,063,570, which is a U.S. National Phase Application of PCT/EP2017/052978 filed 10 Feb. 2017. The entire contents of each aforementioned application is incorporated herein by reference.

TECHNICAL FIELD

Embodiments herein relate to an integrated isolator circuit. In particular, they relate to an integrated isolator circuit for isolating a receiver and a transmitter in a Time-Division Duplex transceiver and a wireless communication device comprising the Time-Division Duplex transceiver.

BACKGROUND

Transmitter (Tx) and receiver (Rx) isolators (Tx/Rx) or transceiver (TRX) switches are commonly used in transceivers in wireless communication devices to protect receiver circuitry from strong Tx signals generated by power amplifiers in transmitter circuitry. If the Tx signals reach the input port of the Rx circuitry without attenuation, the high amplitude of the Tx signals may destroy the sensitive receiver inputs.

FIG. 1 shows a TRX isolator in Tx mode. The Tx switch T1 is ON so it presents a low impedance and the Tx signal gets through to the antenna. However, the Rx switch T2 is OFF and presents a large impedance compared to the receiver input impedance. As a result, most of the Tx signal voltage swing drops across the open Rx switch T2 instead of the Rx input, thus protecting the Rx input from damage.

FIG. 2 shows the Tx/Rx isolator in Rx mode. The Tx switch T1 is OFF in order to stop signals received from antenna from going into the Tx output and increasing the Rx insertion loss. The Rx switch T2 is ON thus presenting a low impedance to the signal received from the antenna.

In order to work properly as part of a transceiver, an isolator must have low Tx insertion loss, low Rx insertion loss and high linearity.

A high Tx insertion loss results in low efficiency of the transmitter while a high Rx insertion loss results in loss of sensitivity for the receiver.

Error Vector Magnitude (EVM) is usually used to measure the quality of a radio receiver or transmitter in digital communications. Noise, distortion, spurious signals, and phase noise all degrade EVM. Low linearity of the isolator may result in poor Adjacent Channel Leakage Power Ratio (ACLR) at the antenna, which compromises the EVM and thus the performance of the transceiver. Switches implemented with Complementary Metal Oxide Semiconductor (CMOS) in current technology are quite non-linear when operating with large signal voltage swings.

Typically, external components are used for implementing the functionality of TRX isolators or switches. However, this approach results in high costs and increased board area.

Integrated Tx/Rx isolation circuits have been reported. However, most of these solutions rely on CMOS switches to provide isolation and take high Tx signal swing. Due to high signal voltage swing at the Tx output, multiple switches usually must be stacked in order to avoid breakdown. However, a large number of stacked switches may result in high insertion loss during Rx operation. Also, in this stacked switches arrangement, careful control of biasing of each device is required which may be quite complicated if the switches are operating at the margin of their voltage handling capability. Furthermore, due to the high voltage swing at the antenna node, it is typically difficult to turn off the devices completely. This may result in increased non-linearity thus leading to reduced ACLR.

SUMMARY

Therefore, it is an object of the embodiments herein to provide an integrated isolator circuit with improved performance for communication transceivers.

According to one aspect of the embodiments herein, the object is achieved by an integrated isolator circuit for isolating a receiver and a transmitter in a Time-Division Duplex transceiver. The integrated isolator circuit comprises a first node, a second node and a third node. The integrated isolator circuit further comprises a fist capacitor connected in series with a first switch and connected between the first and second nodes. The integrated isolator circuit further comprises a first inductor connected between the first and second nodes, and a second capacitor connected between the second node and the third node. The first switch has an on state and an off state, and the integrated isolator circuit is configured to have a different impedance at a certain operating frequency by controlling the state of the first switch.

The integrated isolator circuit according to some of the embodiments herein operates as a third order filter with associated peak and notch resonance frequencies. The peak and notch frequencies of the third order filter are controlled by the first switch such that the impedance at a certain operating frequency is switched to a high or low value as desired. Thus, when using the integrated isolator circuit according to the embodiments herein in a transceiver, low Tx insertion loss and low Rx insertion loss may be achieved by presenting a high impedance during Tx mode and low impedance during Rx mode in the integrated isolator circuit. The first capacitor used in series with the first switch, which may be implemented by, e.g., CMOS or Micro-Electro-Mechanical Systems (MEMS) technology, handles the voltage swing together instead of the first switch alone. In this way, the voltage swing on the switch device is reduced and thus high linearity is achieved.

Further, in some embodiments the peak and notch frequencies of the integrated isolator circuit are tunable by tuning values of the components in the circuit, e.g., the first inductor and the first and second capacitors. Thus, a highly linear, simple structure, tunable TRX switch or isolator may be achieved and may be implemented and integrated on-chip with existing silicon technologies. The integrated isolator circuit may offer even better performance when implemented with upcoming MEMS technology that offers much better switches.

Thus, embodiments herein provide an integrated isolator circuit with improved performance on, e.g., linearity and/or insertion loss. The integrated isolator circuit may also provide reduced cost and/or size due to its relatively simple structure.

BRIEF DESCRIPTION OF THE DRAWINGS

Examples of embodiments herein are described in more detail with reference to attached drawings in which.

DETAILED DESCRIPTION

Figure 2:
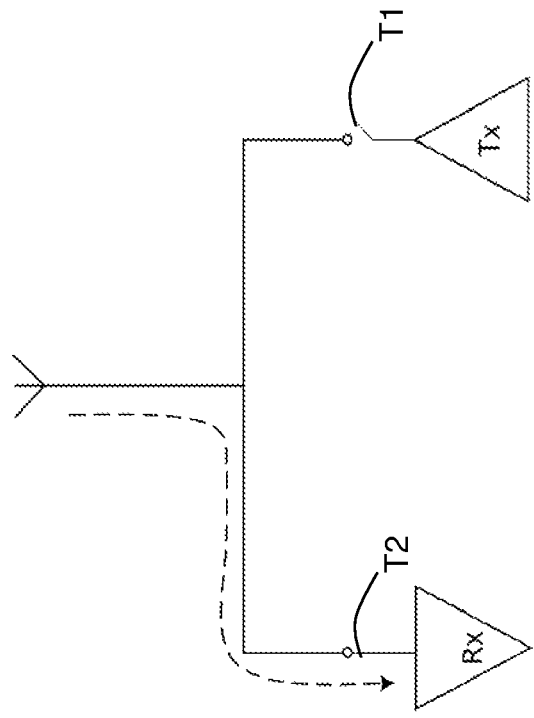
FIG. 2 is a block view of a prior art TRX isolator in Rx mode.
Figure 1:
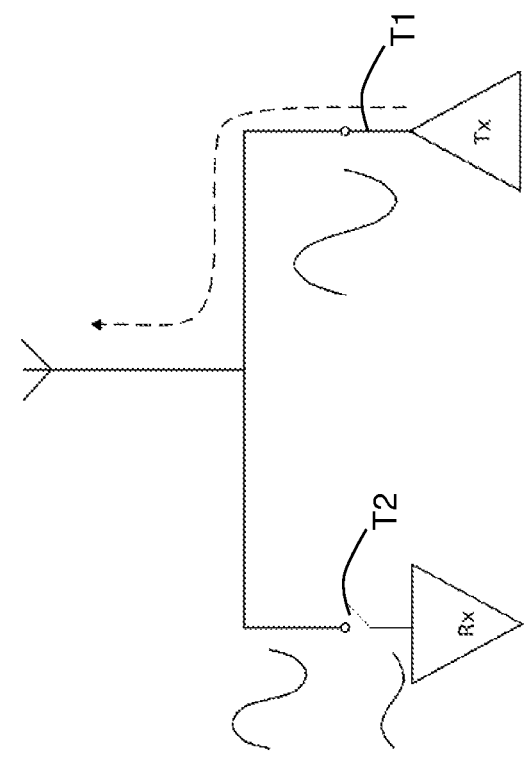
FIG. 1 is a block view of a prior art TRX isolator in Tx mode.
Figure 3:
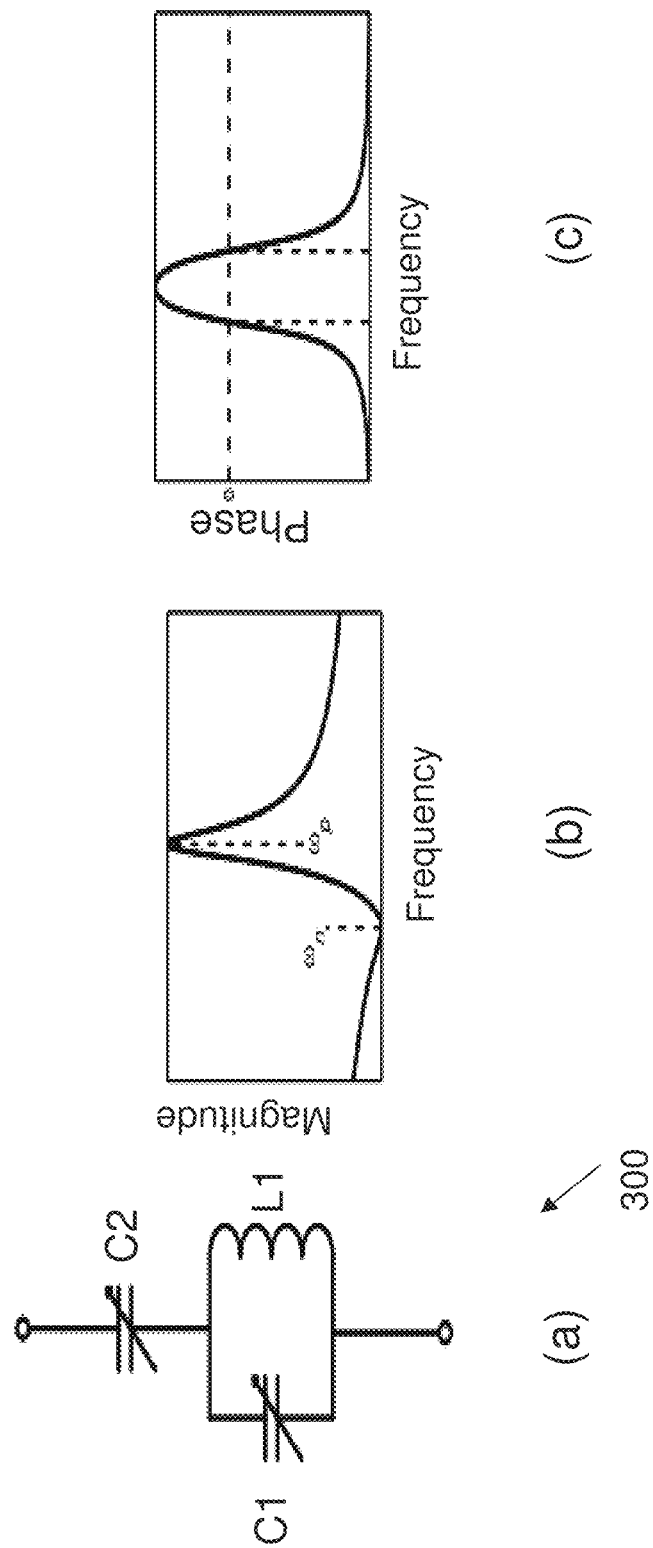
FIG. 3 is a schematic view illustrating a third order filter.

As part of the developing embodiments herein, a third order filter will first be discussed. FIG. 3 shows a third order filter 300(a) along with its magnitude (b) and phase (c) characteristics. Two resonance frequencies are associated with the filter 300, a peak resonance frequency $\omega_p$ and a notch resonance frequency $\omega_n$ as shown in FIG. 3(b).

The peak resonance frequency $\omega_p$ corresponding to a peak in impedance, is determined primarily by values of the components C1 and L1 in the LC parallel tank and the series capacitor C2 may be ignored:

$$\omega_p = \frac{1}{\sqrt{L_1 C_1}}$$

The notch resonance frequency $\omega_n$ corresponding to a notch in impedance, is determined by all three components of the filter 300. It is the frequency at which the reactive part of the parallel tank impedance is equal in magnitude and opposite in sign to the reactance of the series capacitor C2.

$$\omega_n = \sqrt{\frac{1}{L_1} \cdot \frac{1}{C_1 + C_2}}$$

Figure 4:
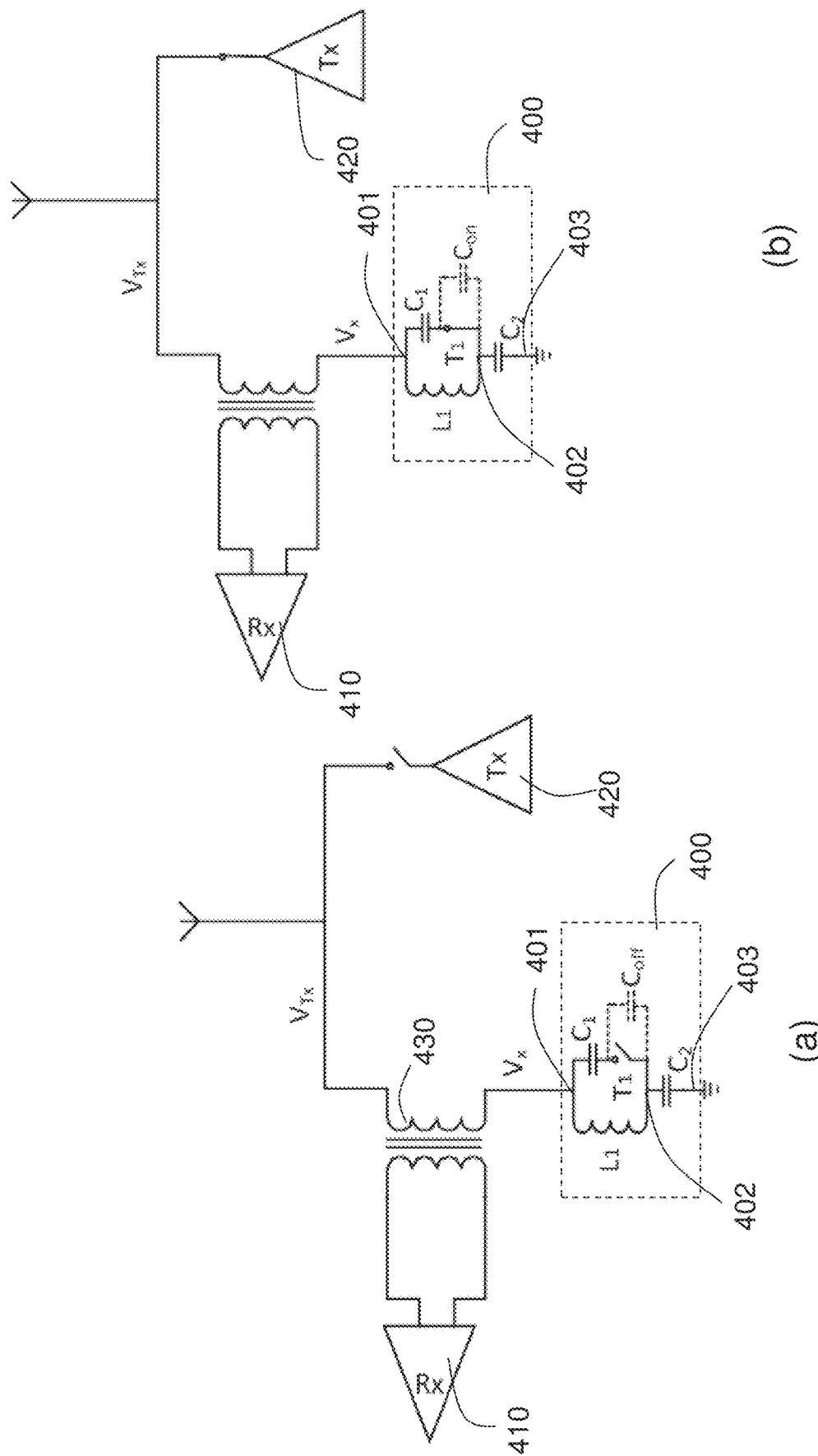
FIG. 4 is a schematic view illustrating an integrated isolator circuit according to one embodiment herein, where (a) is in Rx mode and (b) is in Tx mode.

With these discussions in mind, an integrated isolator circuit 400 according to embodiments herein is shown in FIG. 4. The integrated isolator circuit 400 may be used in a transceiver, e.g., a Time-Division Duplex (TDD) transceiver, for isolating a receiver Rx 410 and a transmitter Tx 420. The TDD transceiver uses a single frequency, alternating between uploading and downloading data over time. Frequencies used for TDD transceivers may range from 1850 MHz to 27 GHz, with several different bands being used.

As shown in FIG. 4, the integrated isolator circuit 400 comprises a first node 401, a second node 402 and a third node 403.

The integrated isolator circuit 400 comprises a fist capacitor C1 connected in series with a first switch T1 and connected between the first and second nodes 401, 402.

The integrated isolator circuit 400 further comprises a first inductor L1 connected between the first and second nodes 401, 402 and a second capacitor C2 connected between the second node 402 and the third node 403.

The first switch T1 has an on state and an off state, and the integrated isolator circuit 400 is configured to have a variable impedance at a certain operating frequency by controlling the state of the first switch T1.

The integrated isolator circuit 400 works as a third order filter and operates in two modes, an Rx mode, where T1 is off as shown in FIG. 4(a), and a Tx mode, where T1 is on as shown in FIG. 4(b). The first switch T1 in series with Ci has a capacitance $C_{sw}$, with value $C_{on}$ or $C_{off}$, such that the resonance frequencies described above are determined by the combination of $C_1$ and $C_{sw}$, i.e., an equivalent tank capacitance of the $C_1$ and $C_{sw}$. The equivalent tank capacitance is:

$$C_{eq} = \frac{C_1 C_{sw}}{C_1 + C_{sw}}$$

The different operations or modes will be discussed in the following.

Transmit Operation (Tx mode):

Assuming $\omega_p$ is the operating frequency, during the Tx operation the integrated isolator circuit 400 should present a large impedance at this frequency. Therefore, the tank is tuned such that:

$$\omega_p = \frac{1}{\sqrt{L_1 C_{eq}}}$$

The first switch T1 in series with $C_1$ is ON during Tx mode and it is designed such that, in Tx mode, $C_{on} >> C_1$, and $C_{eq} \infty C_1$. Therefore, the effect of $C_{on}$ is negligible and $C_1$ determines the peak resonance frequency in the Tx mode. The capacitance value of the first capacitor $C_1$ is thus:

$$C_1 = \frac{1}{\omega_p^2 \cdot L_1}$$

Figure 5:
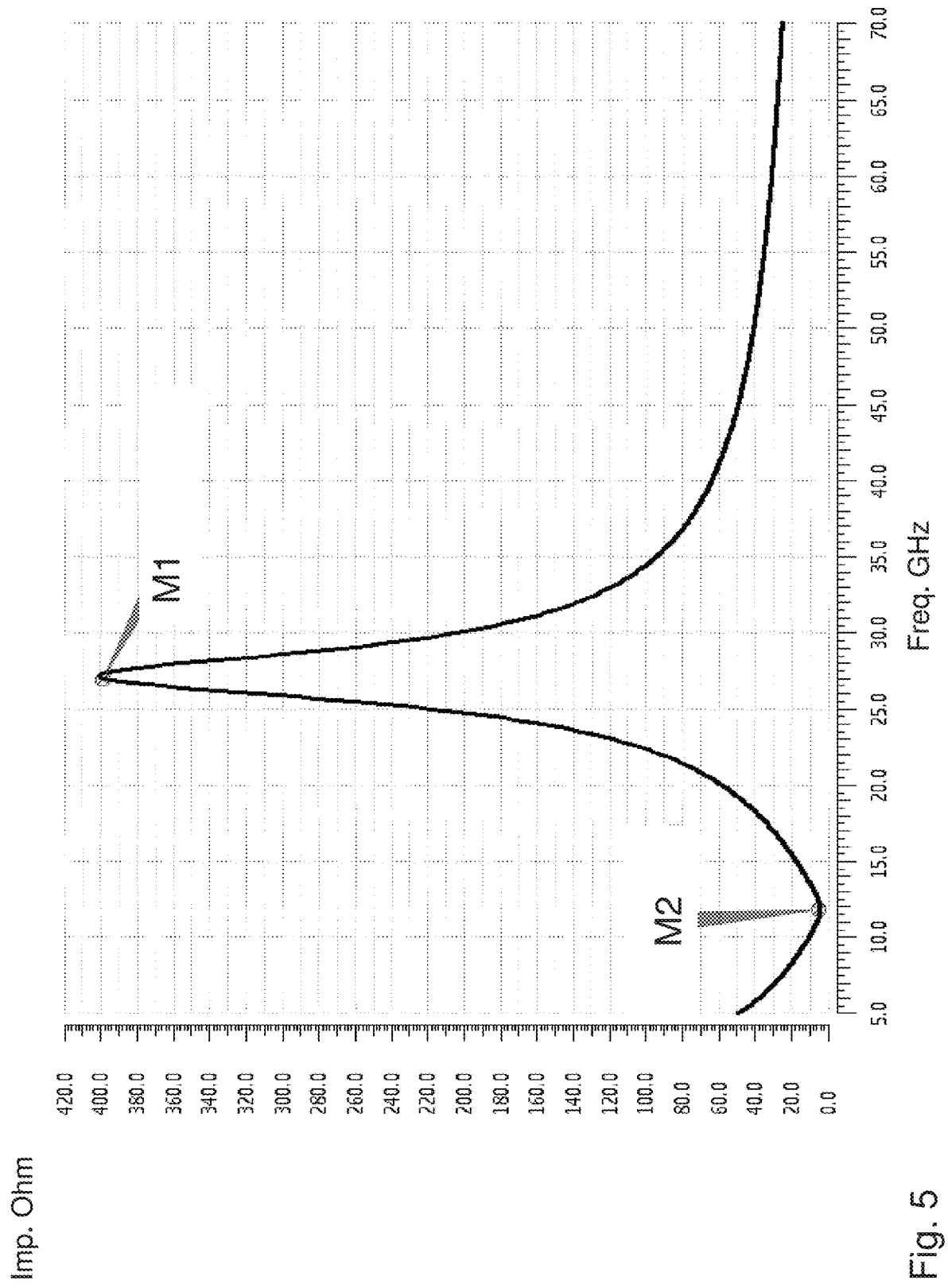
FIG. 5 is a diagram illustrating impedance of an integrated isolator circuit according to embodiments herein in Tx mode.

The integrated isolator circuit 400 presents a large impedance at the operating frequency as shown in FIG. 5. The peak impedance at the operating frequency is ~400 Ohm, as shown by mark M1. The notch is pushed down to ~12 Ghz and the resistance in the notch is around 4 Ohm, as shown by mark M2. This implementation assumed a quality (Q) value of 20 for the first inductor $L_1$.

Figure 6:
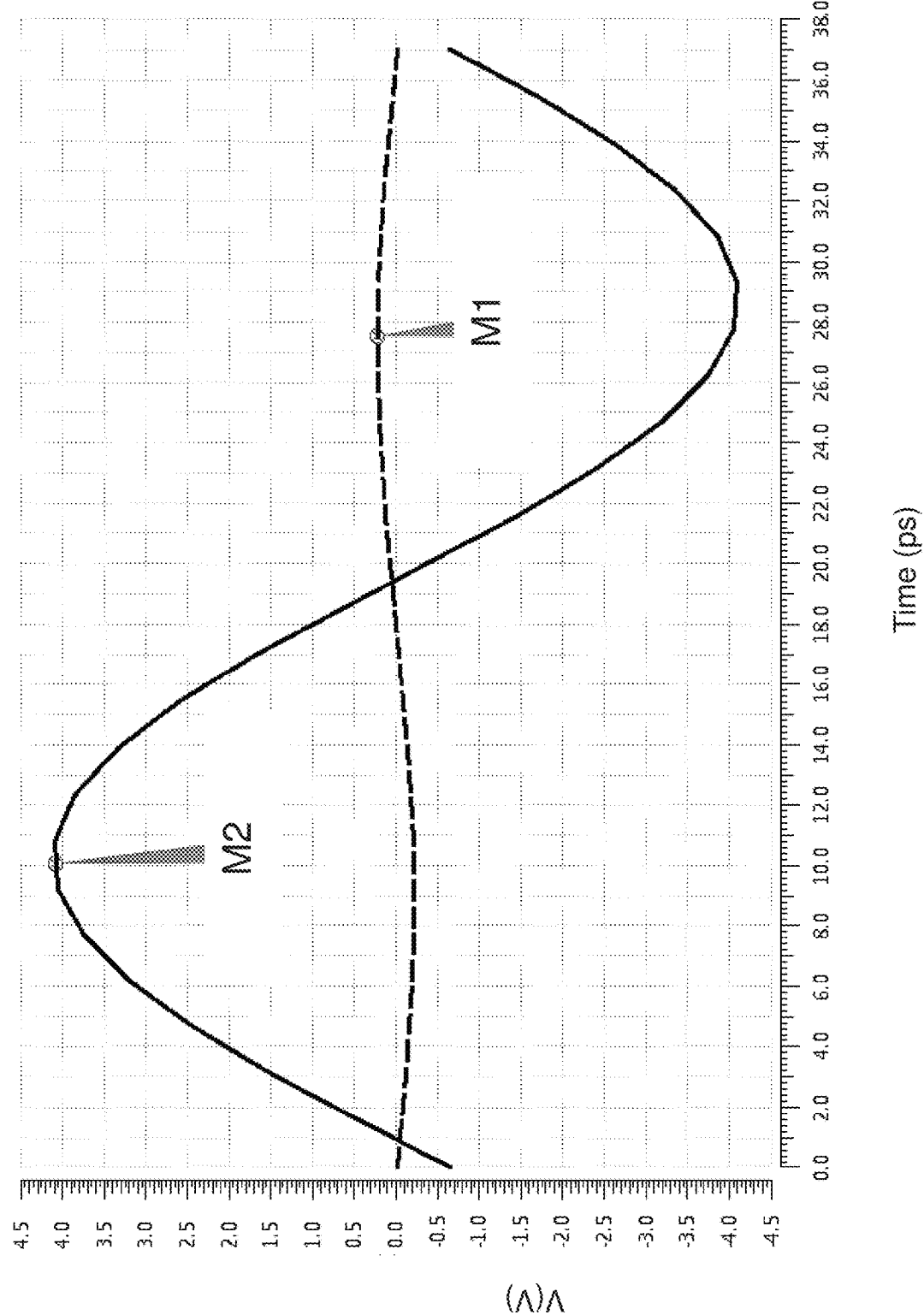
FIG. 6 is a diagram illustrating Tx signal voltages at an antenna and a Rx port.

Due to this large impedance, a small current will flow through the transformer primary part 430 due to the Tx signal and thus a small amount of the Tx signal will reach the Rx 410 port. This is shown in FIG. 6 where a solid line shows the Tx signal voltage at the antenna and a dashed line shows the Tx signal voltage that reaches the Rx port.

Since the first switch T1 in the tank is ON in the Tx mode, it presents a small impedance and almost all the voltage Vx drops across $C_1$. Thus, a very small voltage drops across the first switch T1 which ensures good linearity as well as protection against damage to the first switch T1 from the large Tx voltage swing.

Receive operation (Rx mode):

In the Rx mode, the integrated isolator circuit 400 shows minimum impedance at the operating frequency. In this mode, the first switch T1 in series with $C_1$ is OFF as shown in FIG. 4(a). The first switch T1 is dimensioned such that $C_{eq}$ becomes small, hence pushing the peak resonance to a high frequency. $C_2$ is then designed such that the notch appears at the operating frequency instead. This is done by replacing $C_1$ with $C_{eq}$ in the expression for $\omega_n$.

$$\omega_n = \sqrt{\frac{1}{L_1} \cdot \frac{1}{C_{eq} + C_2}}$$

The capacitance value of $C_2$ may then be calculated as:

$$C_2 = \frac{1}{\omega_n^2 \cdot L_1} - C_{eq}$$

Figure 7:
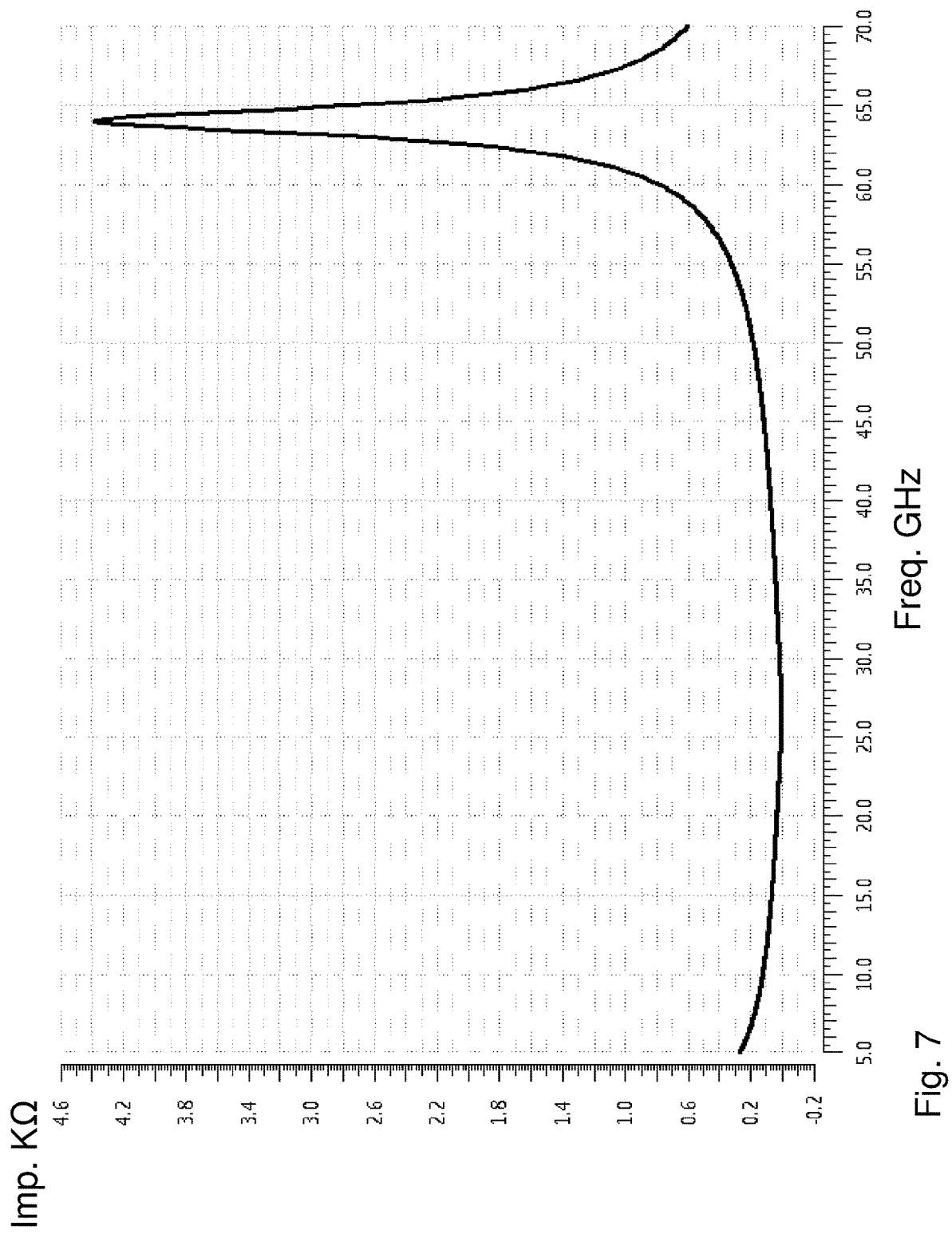
FIG. 7 is a diagram illustrating impedance of an integrated isolator circuit according to embodiments herein in Rx mode.

As shown in FIG. 7, due to the low value of $C_{eq}$ when the first switch T1 is OFF, the tank impedance peak is moved far above the operating frequency. With the proper choice of $C_2$, the impedance notch moves to the operating frequency, e.g. 27 GHz in this case.

Therefore, according to embodiments herein, when the state of the first switch T1 is on during transmitting mode, the integrated isolator circuit 400 is configured to have high impedance at the operating frequency, and when the state of the first switch T2 is off during receiving mode, the integrated isolator circuit 400 is configured to have low impedance at the operating frequency.

Figure 8:
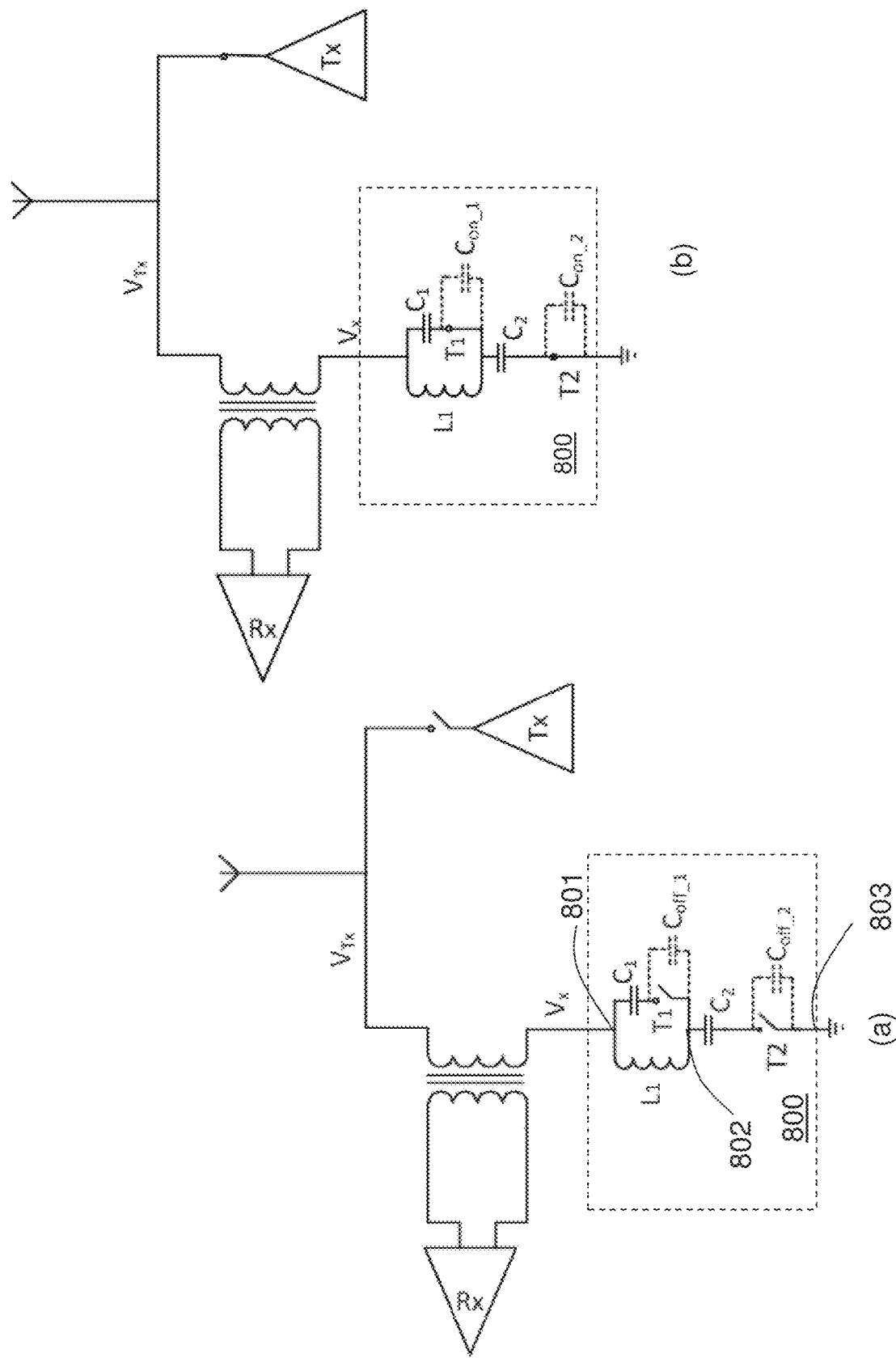
FIG. 8 is a schematic view illustrating an integrated isolator circuit according to one embodiment herein, where (a) is in Rx mode and (b) is in Tx mode.

At high frequencies, the calculated size of the second capacitor $C_2$ may become too small for easy implementation. A switch connected in series with $C_2$ may be used to relax this size requirement. FIG. 8 shows an integrated isolator circuit 800 according to one embodiment herein, where a second switch T2 is connected in series with the second capacitor $C_2$. The integrated isolator circuit 800 operates in the same way as the integrated isolator circuit 400, i.e., operates in two modes, an Rx mode, where T1 is off as shown in FIG. 8(a) and a Tx mode, where T1 is on as shown in FIG. 8(b).

During the Tx operation, $C_2$ does not contribute significantly to the peak impedance of the integrated isolator circuit 800 and therefore the second switch T2 may be kept ON. In Rx mode, the second switch T2 is turned OFF and both $C_2$ and the small off capacitance of the second switch $C_{off\_2}$ are combined to provide the required capacitance value.

In order to further reduce voltage swing across the active devices, i.e., the first switch T1, it is feasible to stack multiple switches. As long as the $C_{off}$ for the stacked switches is significantly larger than $C_1$, the switches will not experience excessive voltage swing. Stacking multiple switches may be necessary, for example, if frequency tuning is required by using one or more parallel switched capacitor branches, where some of the switched capacitor branches may need to be turned off.

Figure 9:
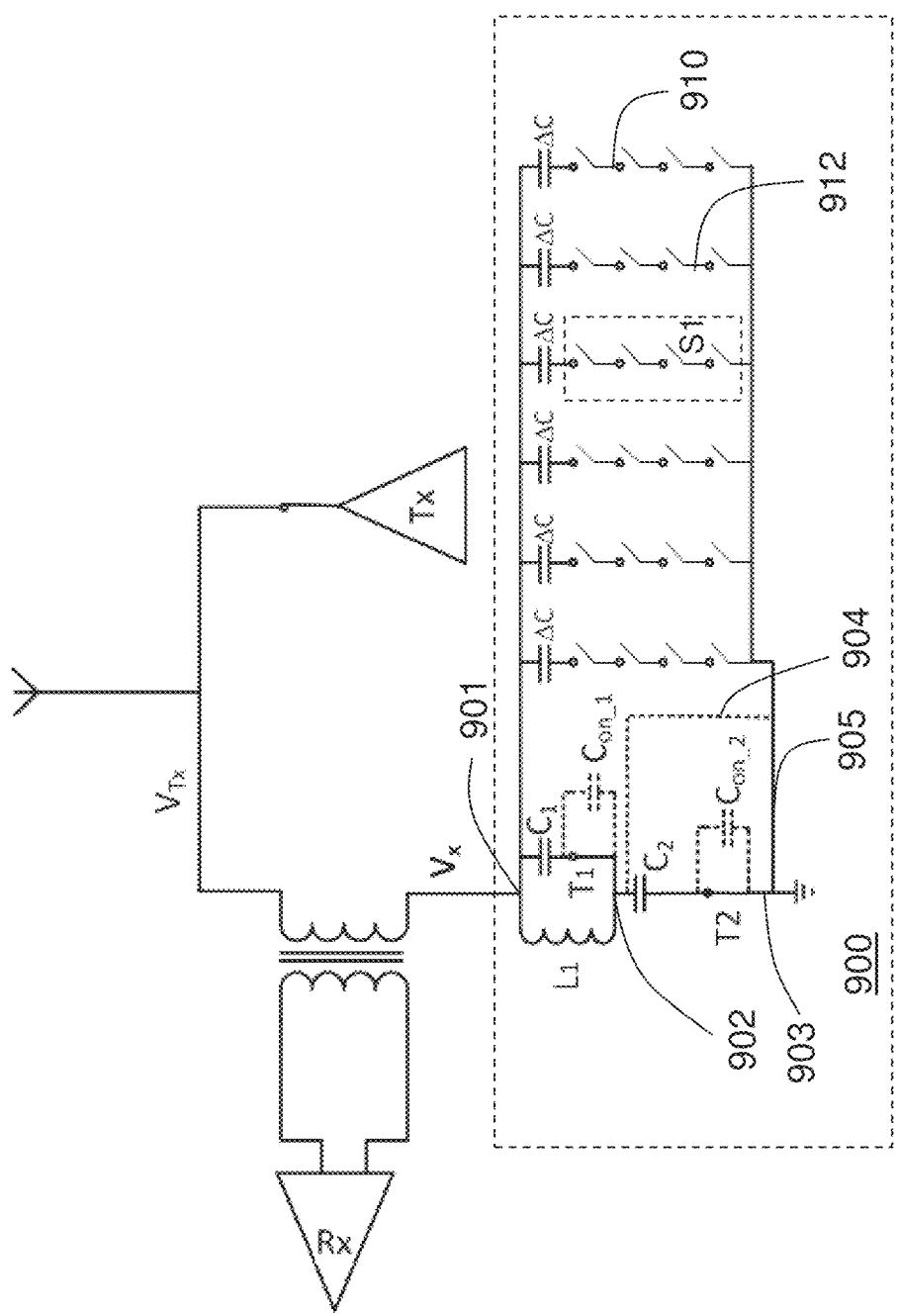
FIG. 9 is a schematic view illustrating an integrated isolator circuit according to one embodiment herein.

FIG. 9 shows an integrated isolator circuit 900 according to one embodiment herein, where the integrated isolator circuit 900 comprises one or more switched capacitor branches 910, 912 ... As shown in FIG. 9, the one or more switched capacitor branches 910, 912 ... may be connected between the first and second nodes (901,902) of the integrated isolator circuit 900, as shown by a dotted line 904, or connected between the first and the third nodes (901, 903) of the integrated isolator circuit 900, as shown by a solid line 905. Each switched capacitor branch may comprise a capacitor $\Delta C$ connected in series with a switch S1, e.g., shown in a dotted line box. The switch S1 in one or more capacitor branches may be implemented by a single switch or multiple stacked switches.

Following the design consideration described above, i.e., the $C_{off}$ for the stacked switches is significantly larger than $\Delta C$, so the additional capacitors $\Delta C$ will be small and will retain a large part of the voltage swing, thus reducing the impact on switch linearity.

Figure 10:
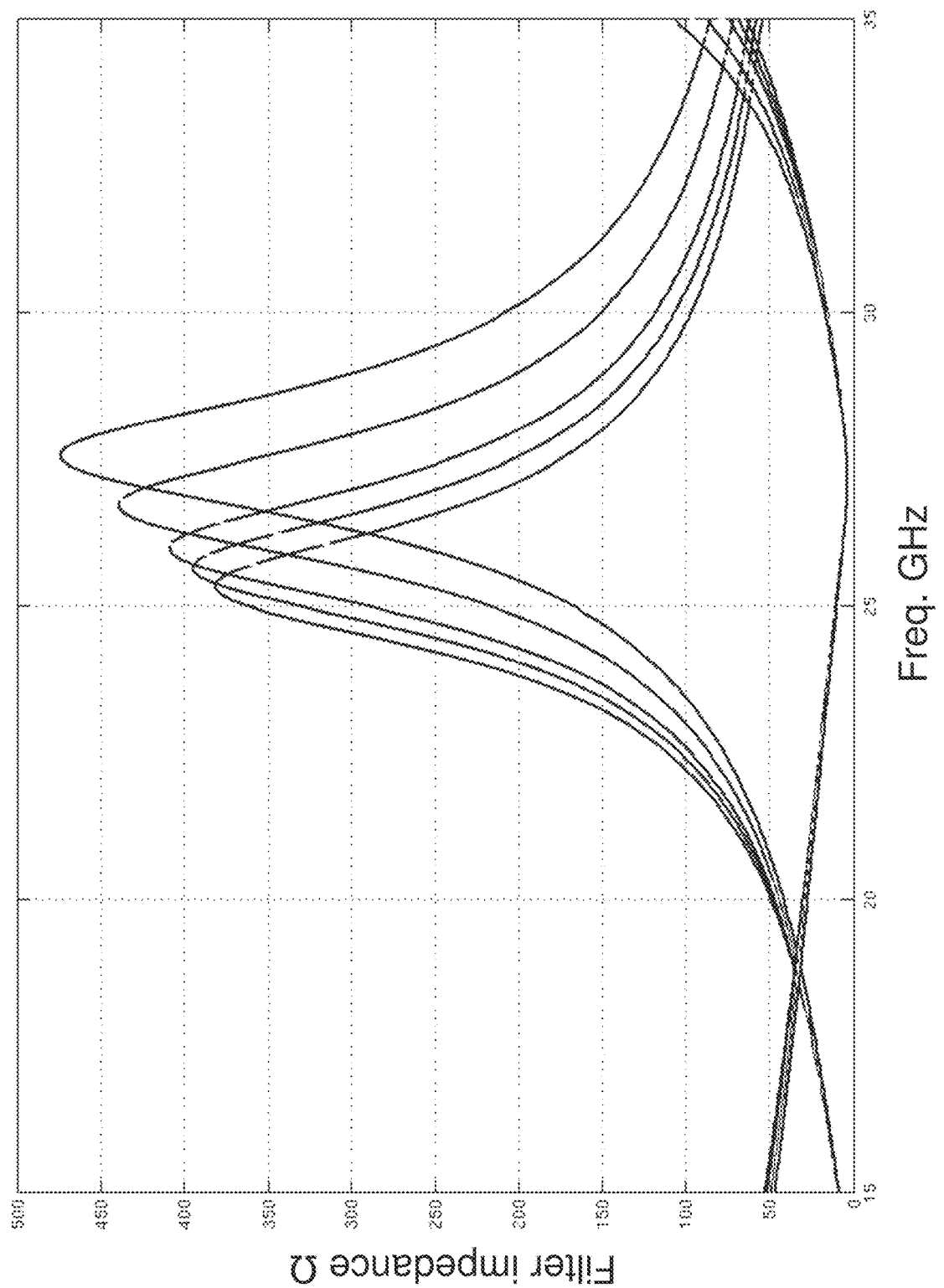
FIG. 10 is a diagram showing the impact of capacitor tuning on impedance of the integrated isolator circuit shown in FIG. 9.

FIG. 10 shows the impact of tuning on impedance of the integrated isolator circuit 900 in the Tx and Rx modes by switching the one or more switched capacitor branches. It can be seen that the peak impedance may be tuned for different operating frequencies for both the Tx and Rx modes.

Figure 11:
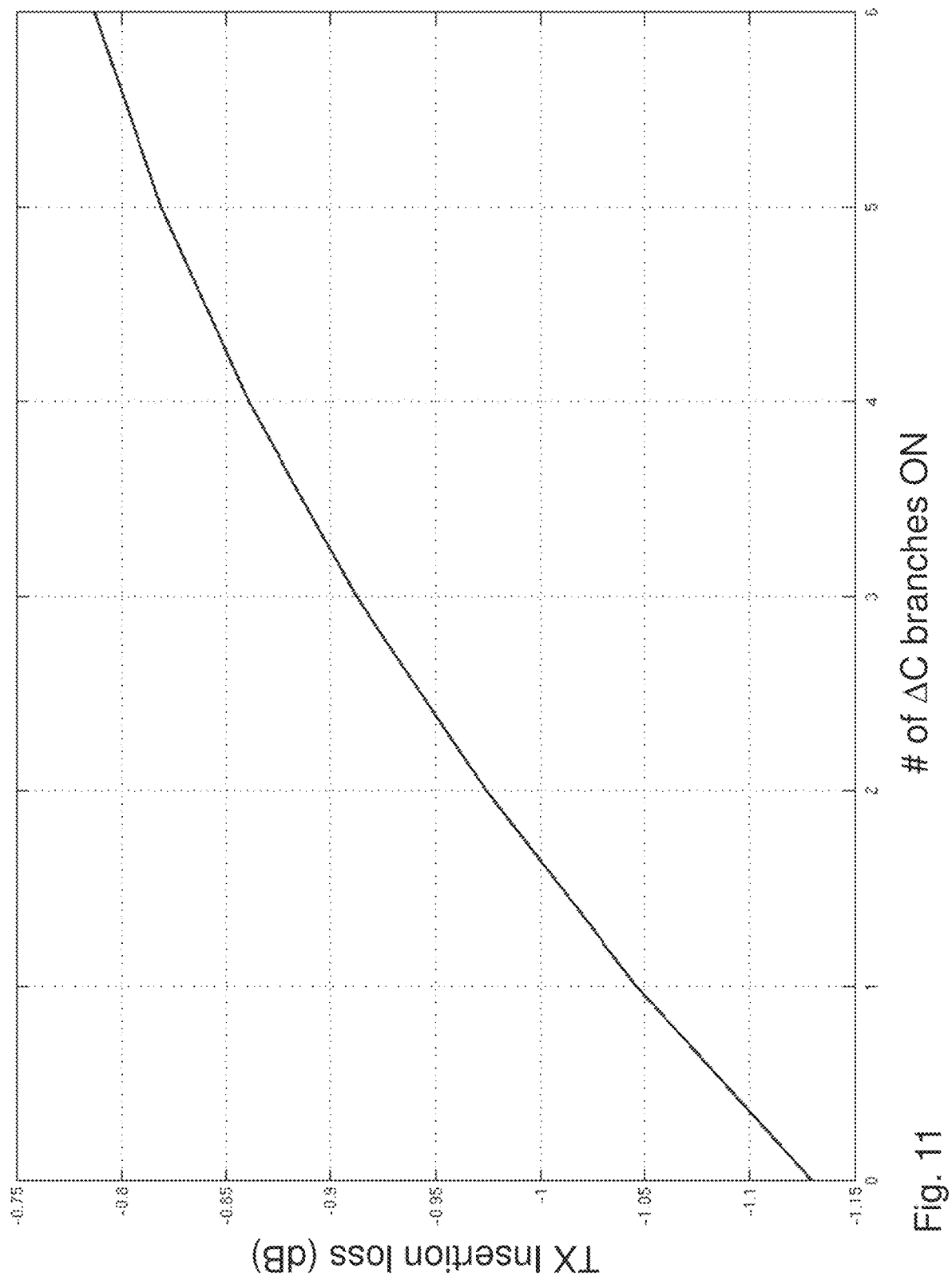
FIG. 11 is a diagram showing Tx insertion loss when the integrated isolator circuit shown in FIG. 9 is used in a transceiver.

FIG. 11 shows the impact of tuning on the Tx insertion loss by switching the one or more switched capacitor branches. It can be seen that the Tx insertion loss increases when more switched capacitor branches are turned on.

In order to show the performance of the integrated isolator circuit according to embodiments herein, some simulations on the integrated isolator circuit 900 have been done. In these simulations, inductor L1 has a Q value of 20, the operating frequency is set to 27 GHz.

The following performance has been observed:
Total Tx Power: 23 dBm
Tx-Rx isolation: >26 dB
Tx insertion loss: 0.89 dB
Rx insertion loss: ~0.5 dB, excluding the transformer loss, i.e., with an ideal transformer
The $3^{rd}$ order intermodulation: IM3<58 dBc, at +23 dBm Tx power level, IM3 will further decrease when turning on more switched capacitor branches.

As can be seen from the above performance, embodiments herein provide an integrated isolator circuit with improved linearity and insertion loss.

Figure 12:
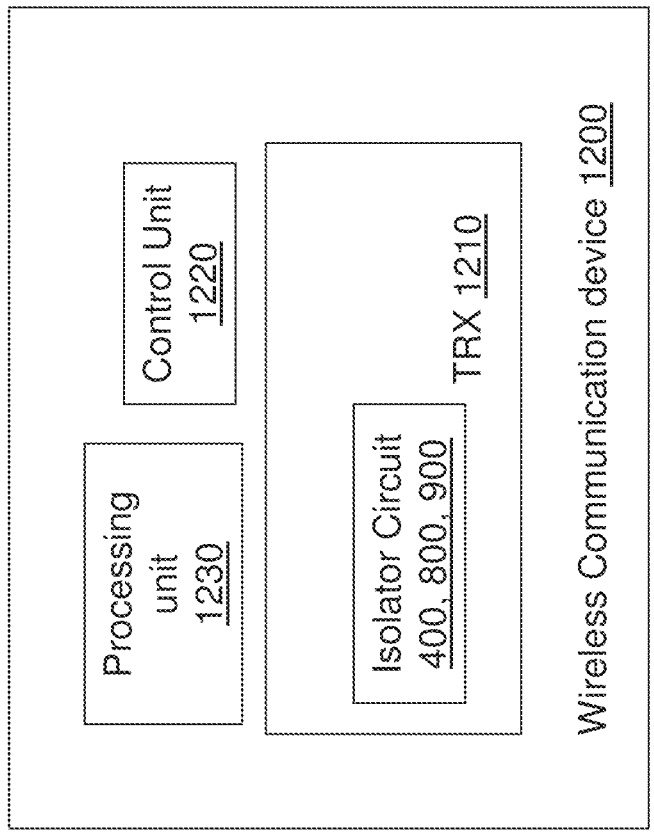
FIG. 12 is a block diagram illustrating a wireless communication device in which embodiments herein may be implemented.

The integrated isolator circuit 400, 800, 900 according to the embodiments herein may be employed in various wireless communication devices. FIG. 12 shows a block diagram of a wireless communication device 1200, which may be a user equipment or a mobile device, a base station or multi-antenna systems in a radio base station. The wireless communication device 1200 may comprise, e.g., a radio frequency transceiver 1210, a control circuit 1220 and other units, where a processing unit 1130 is shown, which may interact with the control circuit 1220 for different tuning and operating of the integrated isolator circuit 400, 800, 900.

Those skilled in the art will understand that the switches in the integrated isolator circuit 400, 800, 900 may be implemented by, e.g., Field-Effect Transistors (FET), Metal-Oxide-Semiconductor FET (MOSFET), Junction FET (JFET), Bipolar Junction Transistors (BJT), CMOS or Micro-Electro-Mechanical Systems (MEMS) technology, etc.

When using the word "comprise" or "comprising" it shall be interpreted as non-limiting, i.e., meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

What is claimed is:

1. A Time-Division Duplex (TDD) transceiver comprising:
   an antenna;
   a transmitter connected to the antenna via a switch;
   a receiver;
   an integrated isolator circuit for isolating the receiver and the transmitter, the integrated isolator comprising:
      a first node, a second node and a third node;
      a first capacitor and a first switch connected in series between the first and second nodes;
      a first inductor connected between the first and second nodes; and
      a second capacitor connected between the second node and the third node; and
   a transformer having a primary winding connected between the antenna and the first node of the integrated isolator circuit, wherein the receiver is connected to a secondary winding of the transformer; and
   wherein the first switch has an on state and an off state, and an impedance of the integrated isolator circuit at a certain operating frequency depends on the state of the first switch.

2. The TDD transceiver according to claim 1, wherein the first switch is in the on state during a transmitting mode, thereby configuring the integrated isolator circuit to have high impedance at a transmit frequency, and wherein the first switch is in the off state during a receiving mode, thereby configuring the integrated isolator circuit to have low impedance at a receive frequency.

3. The TDD transceiver according to claim 1, wherein the integrated isolator circuit comprises a second switch connected in series with the second capacitor, such that the second capacitor and the second switch are in series between the second and third nodes.

4. The TDD transceiver according to claim 1, wherein the first capacitor and the first switch connected in series between the first and second nodes comprise a first one of two or more switched capacitor branches connected in parallel between the first and second nodes.

5. The TDD transceiver according to claim 1, wherein the integrated isolator circuit comprises one or more switched capacitor branches connected between the first and the third nodes.

6. The TDD transceiver according to claim 4, wherein each switched capacitor branch comprises a respective capacitor connected in series with a respective switch.

7. The TDD transceiver according to claim 6, wherein the respective switch in at least one of the one or more switched capacitor branches is implemented by multiple switches connected in series.

8. A wireless communication device comprising a TDD transceiver according to claim 1.

9. A wireless communication device comprising:
   a transmitter connected to an antenna of the wireless communication device via a series switch;
   a transformer having a primary winding connected at one end to the antenna, wherein the other end of the primary winding is shunted by an integrated isolator circuit of the wireless communication device; and
   a receiver connected across a secondary winding of the transformer;
   wherein the integrated isolator circuit is configured to have an adjustable shunt impedance; and
   wherein a control circuit of the wireless communication device is configured to adjust the shunt impedance of the integrated isolator circuit with respect to operation of the wireless communication device in a transmit mode and in a receive mode.

10. The wireless communication device of claim 9, wherein the transmitter is configured to output a transmit signal during the transmit mode, and wherein the control circuit is configured to adjust the shunt impedance to a high value for the transmit mode, to limit the amount of transmit-signal current that flows into the primary winding of the transformer.

11. The wireless communication device of claim 9, wherein the control circuit is configured to adjust the shunt impedance to a low value for the receive mode, such that a majority of receive-signal current flows into the primary winding of the transformer.

12. The wireless communication device of claim 9, wherein the integrated isolator circuit comprises a parallel tank circuit in series with a second capacitor, the parallel tank circuit comprising an inductor in parallel with a series combination of a first capacitor and a switch that has on and off states, for adjustment of the shunt impedance of the integrated isolator circuit.

13. The wireless communication device of claim 12, wherein the control circuit is configured to control the switch to thereby adjust the shunt impedance of the integrated isolator circuit with respect to operation of the wireless communication device in the transmit mode and in the receive mode.

14. The wireless communication device of claim 13, wherein the control circuit is configured to turn on the switch for operation of the wireless communication device in the transmit mode, thereby causing the integrated isolator circuit to present a high shunt impedance to a transmit signal output by the transmitter, and is configured to turn off the switch for operation of the wireless communication device in the receive mode, thereby causing the integrated isolator circuit to present a low shunt impedance to a receive signal incoming via the antenna.

15. The wireless communication device of claim 12, wherein the switch comprises a transistor switch or a Micro-Electrical-Mechanical-System (MEMS) switch.

16. The wireless communication device of claim 12, wherein the resonance frequency of the parallel tank circuit depends on the capacitance of the first capacitor, in combination with the capacitance of the switch, and wherein the capacitance of the switch depends on whether the switch is in the off state or the on state.

17. The wireless communication device of claim 16, where the capacitance of the second capacitor is sized so that a frequency notch appears at a frequency of a receive signal to be received by the wireless communication device.

18. The wireless communication device of claim 12, wherein the integrated isolator circuit comprises a further switch connected in series with the second capacitor, and wherein the control circuit is configured to set the further switch to an on state for operation of the wireless communication device in the transmit mode, and to set the further switch to an off state for operation of the wireless communication device in the receive mode.

19. The wireless communication device of claim 12, wherein the switch comprises multiple switches in series, and wherein the off-state capacitance presented by the multiple switches is substantially larger than the capacitance of the first capacitor.

20. The wireless communication device of claim 12, wherein the series combination of the first capacitor and the switch in the parallel tank circuit comprises one among multiple switched-capacitor branch circuits in parallel with the inductor of the parallel tank circuit, each switched-capacitor branch circuit having a corresponding capacitor connected in series with a corresponding switch, and wherein the control circuit is configured to control the corresponding switches to tune the shunt impedance of the integrated isolator circuit with respect to different transmit or receive frequencies used by the wireless communication device.

* * * * *